United States Patent
Steger et al.

(10) Patent No.: US 10,879,193 B2
(45) Date of Patent: Dec. 29, 2020

(54) CIRCUIT SYSTEMS

(71) Applicant: Snap Inc., Santa Monica, CA (US)

(72) Inventors: Stephen Andrew Steger, Santa Monica, CA (US); Emily Lauren Clopp, Santa Monica, CA (US)

(73) Assignee: Snap Inc., Santa Monica, CA (US)

(*) Notice: Subject to any disclaimer, the term of this patent is extended or adjusted under 35 U.S.C. 154(b) by 0 days.

(21) Appl. No.: 16/903,016

(22) Filed: Jun. 16, 2020

(65) Prior Publication Data

US 2020/0312785 A1 Oct. 1, 2020

Related U.S. Application Data

(63) Continuation of application No. 15/871,613, filed on Jan. 15, 2018, now Pat. No. 10,714,429.

(51) Int. Cl.
*H01L 23/552* (2006.01)
*H05K 9/00* (2006.01)
*H05K 1/02* (2006.01)

(52) U.S. Cl.
CPC ......... *H01L 23/552* (2013.01); *H05K 1/0216* (2013.01); *H05K 9/0081* (2013.01)

(58) Field of Classification Search
CPC combination set(s) only.
See application file for complete search history.

(56) References Cited

U.S. PATENT DOCUMENTS

| | | | |
|---|---|---|---|
| 8,933,346 B1* | 1/2015 | Kramer | H05K 9/0016 174/355 |
| 10,714,429 B1 | 7/2020 | Steger et al. | |
| 2011/0223779 A1* | 9/2011 | Chen | H05K 9/0064 439/66 |
| 2014/0204554 A1* | 7/2014 | Yu | H05K 1/0216 361/784 |
| 2014/0262473 A1* | 9/2014 | Robinson | H05K 9/0032 174/372 |
| 2014/0268780 A1* | 9/2014 | Wang | F21S 4/22 362/249.06 |
| 2015/0014026 A1* | 1/2015 | Park | H05K 1/0216 174/254 |
| 2016/0095266 A1* | 3/2016 | Liu | H05K 9/003 174/384 |

(Continued)

OTHER PUBLICATIONS

"U.S. Appl. No. 15/871,613, Non Final Office Action dated Oct. 21, 2019", 8 pgs.

(Continued)

*Primary Examiner* — Adam D Houston
(74) *Attorney, Agent, or Firm* — Schwegman Lundberg & Woessner, P.A.

(57) ABSTRACT

Various circuit board systems and methods of use and manufacture thereof are disclosed. A circuit board system can have a first circuit board including a substrate and a first component susceptible to electromagnetic interference carried by the substrate. The system can also include a second circuit board including a second substrate, and a shield engaged to the substrate of the first component, the shield at least partially covering the first component and being configured to protect the first component from electromagnetic interference, wherein the shield couples the substrate of the first circuit board to the substrate of the second circuit board.

19 Claims, 5 Drawing Sheets

(56) References Cited

U.S. PATENT DOCUMENTS

| | | |
|---|---|---|
| 2017/0181268 A1* | 6/2017 | Chiu ...................... H05K 3/284 |
| 2017/0257974 A1* | 9/2017 | Cola ...................... B82Y 30/00 |
| 2019/0008033 A1* | 1/2019 | Chung ................. H05K 9/0098 |
| 2019/0035749 A1* | 1/2019 | Dalmia ................. H01L 23/552 |
| 2019/0082535 A1* | 3/2019 | Myers .................... H05K 1/144 |

OTHER PUBLICATIONS

"U.S. Appl. No. 15/871,613, Notice of Allowance dated Mar. 9, 2020", 5 pgs.

"U.S. Appl. No. 15/871,613, Response filed Feb. 21, 2020 to Non Final Office Action dated Oct. 21, 2019", 8 pgs.

"U.S. Appl. No. 15/871,613, Response filed Aug. 28, 2019 to Restriction Requirement dated May 28, 2019", 9 pgs.

"U.S. Appl. No. 15/871,613, Restriction Requirement dated May 28, 2019", 6 pgs.

\* cited by examiner

CIRCUIT SYSTEMS

CLAIM OF PRIORITY

This application is a continuation of U.S. patent application Ser. No. 15/871,613, filed on Jan. 15, 2018, which is incorporated herein by reference in its entirety.

BACKGROUND

To fit electronics into certain-size enclosures, it is often necessary to create a printed circuit board (PCB) with rigid and flexible sections that can fold into a smaller footprint. Once the rigid-flexible PCB has been folded into a shape, it can be challenging to hold it in that shape during and after assembly. In some cases, the PCB is held together using tape, fasteners, or other components forming part of the PCB assembly. Yet, space on the PCB can be extremely confined in certain applications. As such, finding space for tape, fasteners, or other components can be challenging and might necessitate using a larger PCB. This can be undesirable as the particular application at hand might necessitate using a PCB of a certain size or smaller.

BRIEF DESCRIPTION OF THE FIGURES

The above-mentioned and other features and advantages of this disclosure, and the manner of attaining them, will become more apparent and the disclosure itself will be better understood by reference to the following description of examples taken in conjunction with the accompanying drawings, wherein.

Corresponding reference characters indicate corresponding parts throughout the several views. The exemplifications set out herein illustrate examples of the disclosure, and such exemplifications are not to be construed as limiting the scope of the disclosure any manner.

DETAILED DESCRIPTION

In describing the examples of the disclosure illustrated and to be described with respect to the drawings, specific terminology will be used for the sake of clarity. However, the disclosure is not intended to be limited to any specific terms used herein, and it is to be understood that each specific term includes all technical equivalents.

The present disclosure is directed to circuit systems that utilize unique protective and connective components to enable the circuit system to maintain a certain configuration, or be coupled in unique way. The circuit systems of the examples below can use an electromagnetic-resistant shield as a coupling mechanism for interlocking certain components of a circuit system together, and/or for protecting certain components from electromagnetic interference. In this way, the circuit system can be folded into a shape and retain that shape during and after assembly while maintaining a small footprint and/or protecting components from unwanted interference.

Figure 1:
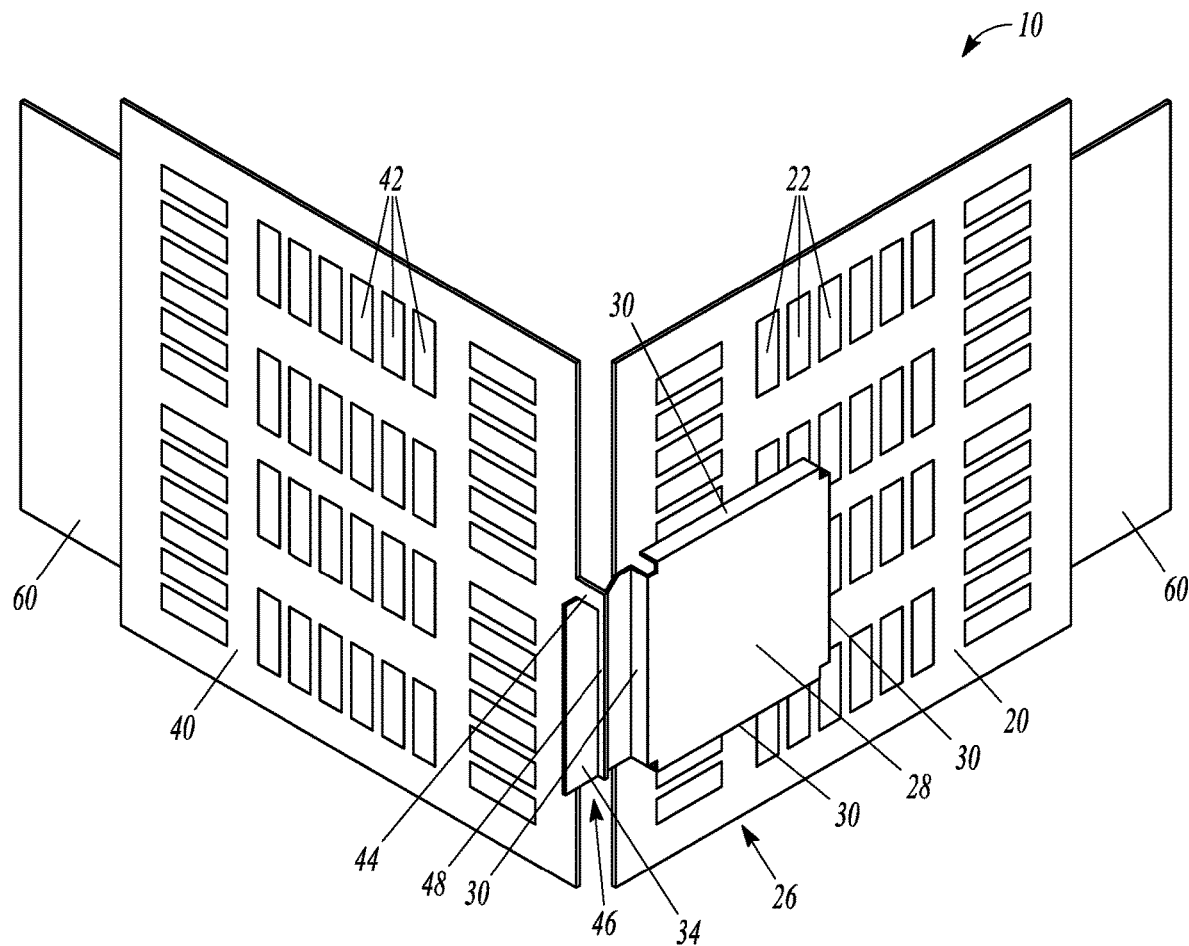
FIG. 1 is a perspective view of a circuit system, according to a first example of the disclosure.

Referring to FIG. 1, a first example of a circuit system 10 is shown. Circuit system 10 can have a first circuit board 20. First circuit board 20 can be a printed circuit board (PCB) and can have a rigid body (e.g., a substrate, which in an example can be rigid). First circuit board 20 can have electronic components 22 on circuit board 20 to, for example, control the operation of circuit board 20. In an example, components 22 can be any component commonly used with a circuit board, including but not limited to a battery, resistor, transistor, capacitor, inductor, diode, switch, etc. Components 22 can be connected using electrical traces (e.g., copper), as is common in circuit constructions. In addition, certain components 22 can be susceptible to electromagnetic interference (EMI). EMI in a circuit board or circuit system can cause failure of the circuit board or system and it is usually advisable to avoid or mitigate any EMI issues.

In this regard, circuit board 20 can also include a shield 26. Shield 26 can be composed of a material that is resistant to EMI. For example, shield 26 can be composed of a metal or metal alloy (e.g., sheet metal). Shield 26 can be disposed on circuit board 20 to at least partially cover and protect one (1) or more components 22 that are susceptible to EMI. In an example, shield 26 can encapsulate one (1) or more components 22 to block EMI from affecting the component(s) 22. In a further example, shield 26 can have a top 28 and sides 30 that can collectively form an interior cavity for receiving the one (1) or more EMI-susceptible components 22. In addition, sides 30 can, in an example, engage with part of circuit board 20 to fix shield 26 to circuit board 20. For instance, sides 30 can engage with a press-fit mechanism or another connection mechanism that can secure shield 26 to circuit board 20. Shield 26 can further include an interlock tab 34 used to connect shield 26 to another component of circuit system 10, as detailed below.

Circuit system 10 can include, as shown in FIG. 1, a second circuit board 40. Second circuit board 40 can be a PCB and can have a rigid body (e.g., a substrate, which in an example can be rigid). Second circuit board 40 can have electronic components 42 on circuit board 40 to, for example, control the operation of circuit board 40. In an example, components 42 can be any component commonly used with a circuit board, including but not limited to a battery, resistor, transistor, capacitor, inductor, diode, switch, etc. Components 42 can be connected using electrical traces (e.g., copper), as is common in circuit constructions. Second circuit board 40 can also include a connection mechanism 44. Connection mechanism 44 can constitute an arm 48 that extends from circuit board 40 (e.g., the substrate thereof). Arm 48 can define an opening 46 through which interlock tab 34 can be inserted.

Either or both of circuit boards 20, 40 can have a flexible circuit 60 coupled thereto. Flexible circuits 60 can be any flexible circuit known in the art. In an example, flexible circuits 60 can comprise an array of conductors bonded to a thin dielectric film.

Still referring to FIG. 1, as alluded to previously, shield 26 can act as a connection mechanism for connecting first circuit board 20 (e.g., the substrate thereof) to second circuit board 40 (e.g., the substrate thereof). As shown, interlock tab 34 of shield 26 can be inserted into opening 46 of connection mechanism 44 to connect shield 26 to second circuit board 40 (e.g., the substrate thereof). In an example, interlock tab 34 can be rigid and can contact interior walls of opening 46 of connection mechanism 44 to fix first circuit board 20 (e.g., the substrate thereof) relative to second circuit board 40 (e.g., the substrate thereof) at a certain angle. Alternatively, there can be an amount of play in the interlock between interlock tab 34 and opening 46 of connection mechanism 44, such that first circuit board 20 (e.g., the substrate thereof) can articulate or pivot within a certain range of angles relative to second circuit board 40 (e.g., the substrate thereof). In any case, shield 26 can simultaneously act as both an EMI protection mechanism and as a connection mechanism between first circuit board 20 (e.g., the substrate thereof) and second circuit board 40 (e.g., the substrate thereof). In this way, circuit system 10 might not require additional tape, fasteners, or other connection mechanisms for joining first circuit board 20 (e.g., the substrate thereof) to second circuit board 40 (e.g., the substrate thereof). As can also be appreciated, shield 26 can permit a user to move or place first circuit board 20 (e.g., the substrate thereof) in a certain position or shape relative to second circuit board 40 (e.g., the substrate thereof), and shield 26 and connection mechanism 44 can act to substantially fix first and second circuit boards 20, 40 (e.g., the substrates thereof) in the set position or shape. Circuit system 10 can therefore provide a circuit system that utilizes a unique connection mechanism, which can serve multiple purposes and allow circuit system 10 to maintain a small footprint during assembly and use.

Figure 2:
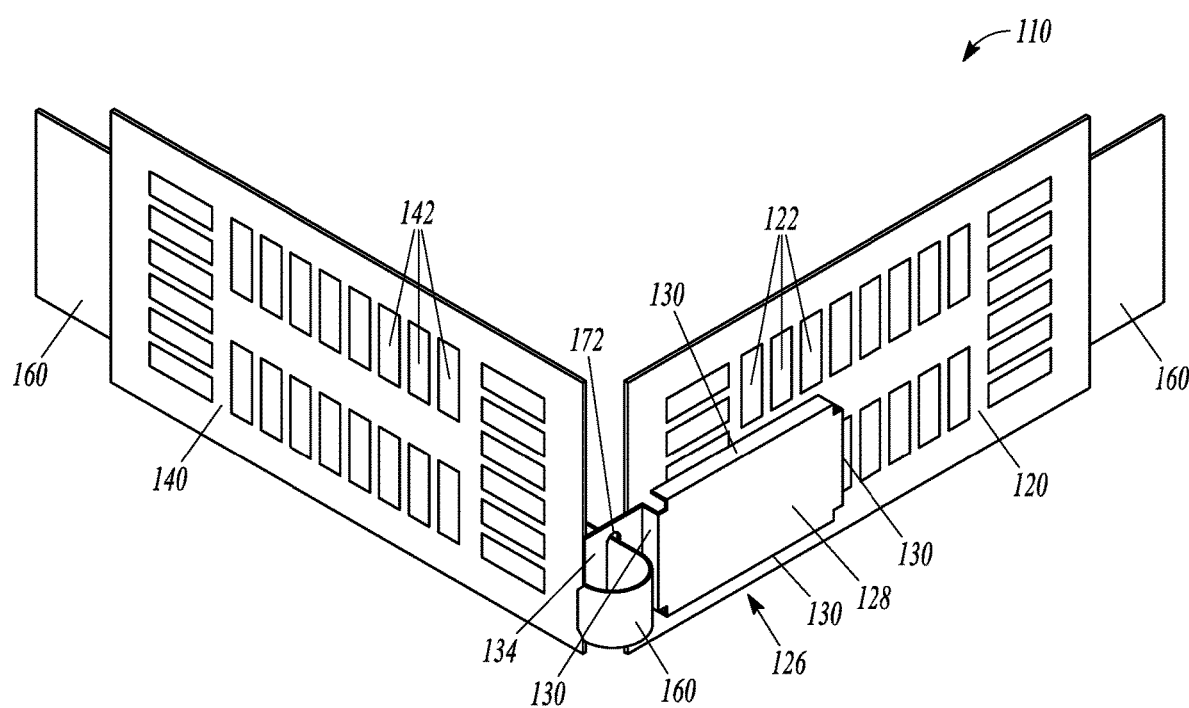
FIG. 2 is a perspective view of a circuit system, according to a second example of the disclosure.

A second circuit system 110 is shown in FIG. 2. Here, like reference numerals are used to refer to like elements, except in the 100 series. It is therefore to be understood that second circuit system 110 can include any of the features or mechanisms of first circuit system 10 set forth above, and that only the differences between circuit systems 10, 110 are discussed below.

Second circuit system 110 can include many of the same features and mechanisms as first circuit system 10 above, except that its interlock tab 134 and connection mechanism 144 can be somewhat different. As illustrated in FIG. 2, interlock tab 134 of shield 126 can include an opening 172, and a flexible circuit 160 can extend from second circuit board 140 (e.g., the substrate thereof). Opening 172 can be sized and shaped to receive a portion of flexible circuit 160 (e.g., the entire horizontal extent of flexible circuit 160). In addition, flexible circuit 160 can be curved, in an example. Flexible circuit 160 can be inserted through opening 172 of interlock tab 134 so that first circuit board 120 (e.g., the substrate thereof) can be coupled to second circuit board 140 (e.g., the substrate thereof). Further, flexible circuit 160 can be bent to pivot or articulate first circuit board 120 (e.g., the substrate thereof) relative to second circuit board 140 (e.g., the substrate thereof) within a range of angles. After being bent, flexible circuit 160 can hold its shape and therefore fix first circuit board 120 (e.g., the substrate thereof) relative to second circuit board 140 (e.g., the substrate thereof) in the bent shape/orientation. In addition, in an example, flexible circuit 160 can be inserted through opening 172 of interlock tab 134 in a straight shape, and then be bent into the curved shape shown in FIG. 2 to ensure that flexible circuit 160 is locked within opening 172.

Figure 3:
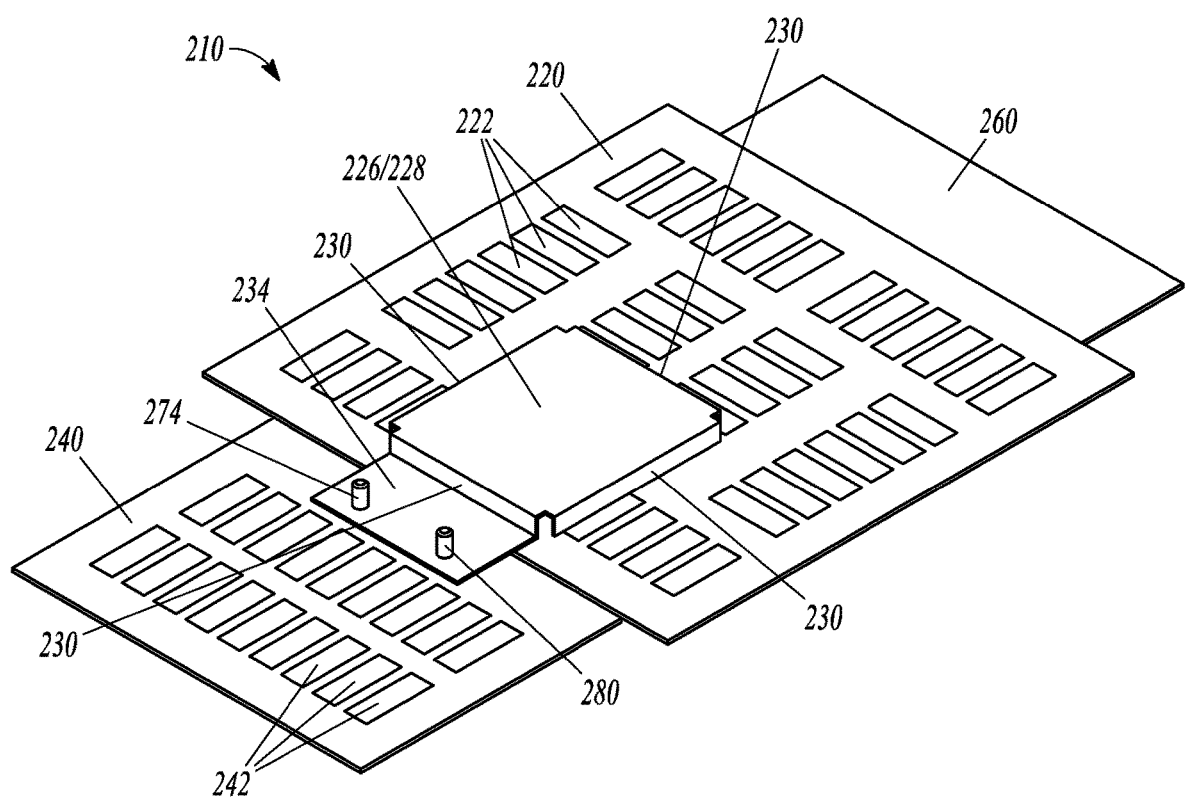
FIG. 3 is a perspective view of a circuit system, according to a third example of the disclosure.

A third circuit system 210 is shown in FIG. 3. Here, like reference numerals are used to refer to like elements, except in the 200 series. It is therefore to be understood that third circuit system 210 can include any of the features or mechanisms of first and second circuit systems 10, 110 set forth above, and that only the differences between circuit systems 10, 110, 210 are discussed below.

Third circuit system 210 can include an interlock tab 234 of its shield 226, which can have a plurality of openings 274. In addition, second circuit board 240 (e.g., the substrate thereof) can have a plurality of bosses 280. Bosses 280 can be inserted into each corresponding opening 274 to connect first circuit board 220 (e.g., the substrate thereof) to second circuit board 240 (e.g., the substrate thereof). Bosses 280 can therefore be used for location purposes. In addition, in some examples, bosses 280 can be used for heat staking. In an alternate example, element 240 can be a plastic part or housing instead of a second circuit board, which can include bosses 280 that can be used for heat staking.

Figure 4:
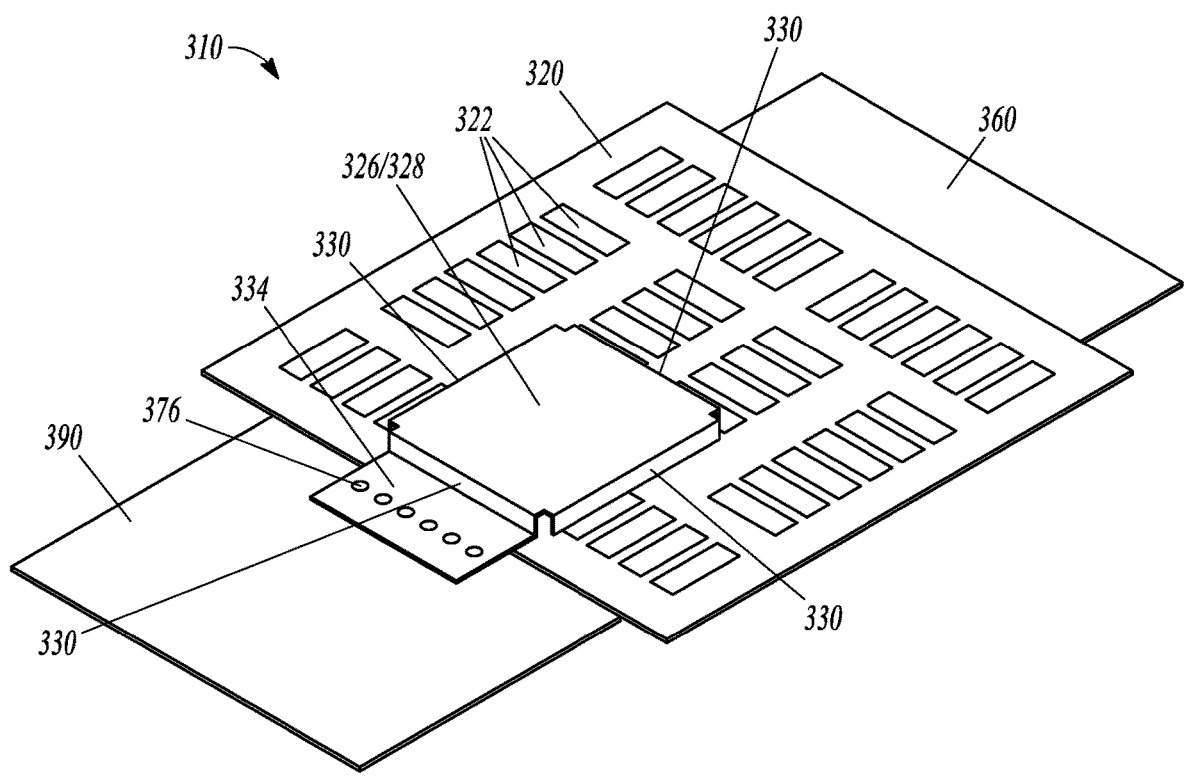
FIG. 4 is a perspective view of a circuit system, according to a fourth example of the disclosure.

A fourth circuit system 310 is shown in FIG. 4. Here, like reference numerals are used to refer to like elements, except in the 300 series. It is therefore to be understood that fourth circuit system 310 can include any of the features or mechanisms of first through third circuit systems 10, 110, 210 set forth above, and that only the differences between circuit systems 10, 110, 210, 310 are discussed below.

Fourth circuit system 310 can include an interlock tab 334 of its shield 326, which can utilize a laser-welding pattern 376 to connect to another circuit board or another component of system 310. Indeed, in an example, circuit system 310 can further comprise another metal part 390 of the assembly, and laser-welding pattern 376 can connect first circuit board 320 (e.g., the substrate thereof) to metal part 390.

Figure 5:
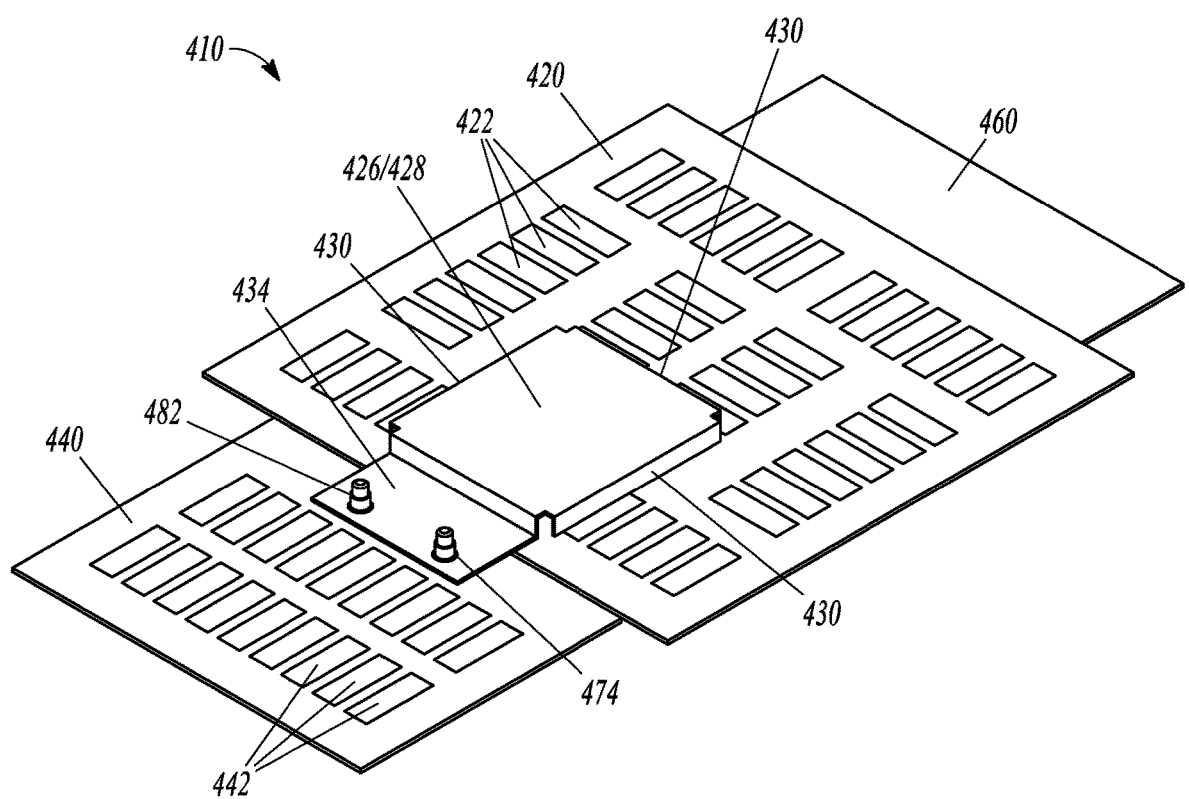
FIG. 5 is a perspective view of a circuit system, according to a fifth example of the disclosure.

A fifth circuit system 410 is shown in FIG. 5. Here, like reference numerals are used to refer to like elements, except in the 400 series. It is therefore to be understood that fifth circuit system 410 can include any of the features or mechanisms of first through fourth circuit systems 10, 110, 210, 310 set forth above, and that only the differences between circuit systems 10, 110, 210, 310, 410 are discussed below.

Fifth circuit system 410 can include an interlock tab 434 of its shield 426, which can have a plurality of openings 474. In an example, openings 474 can be threaded. In addition, second circuit board 440 (e.g., the substrate thereof) can include a plurality of openings (not shown) for receiving a set of screws 482. Screws 482 can be inserted through the openings (not shown) in second circuit board 440, and then threaded into openings 474 of interlock tab 434 of shield 426. In this way, first circuit board 420 (e.g., the substrate thereof) can be coupled to second circuit board 440 (e.g. the substrate thereof) by inserting screws 482 through the openings (not shown) in second circuit board 440 and into threaded openings 474 of interlock tab 434 of shield 426.

From the described example embodiments, various benefits of providing a dual-function shield component in an assembly of electronics component will be evident. One benefit is that compactness of the assembly is promoted by utilizing a single shield component to serve both shielding functions and connection and/or spatial location functions. Such space-saving benefits are further amplified in embodiments in which a shielding portion and a connective portion of the shield component is of one-piece construction, e.g., being of folded metal plate. A further benefit is that is that assembly of the device is simplified in that the shield component serves to locate one or more parts of the assembly in position during assembly, without requiring the provision of additional tooling or parts.

It will be readily understood to those skilled in the art that various other changes in the details, material, and arrangements of the parts and method stages which have been described and illustrated in order to explain the nature of the inventive subject matter can be made without departing from the principles and scope of the inventive subject matter as expressed in the subjoined claims. For example, the order of method steps or stages can be altered from that described above, as would be appreciated by a person of skill in the art. As another example, different connection mechanisms between the EMI shield of the above circuit systems and other components of the system (e.g., substrates, metal components, etc.) are contemplated, such as snap-fit connections, ultrasonic bonding, and the like.

It will also be appreciated that the various dependent claims, examples, and the features set forth therein can be combined in different ways than presented above and/or in the initial claims. For instance, any feature(s) from the above examples can be shared with others of the described examples, and/or a feature(s) from a particular dependent claim may be shared with another dependent or independent claim, in combinations that would be understood by a person of skill in the art.

SUMMARY

To better illustrate the system disclosed herein, a non-limiting list of examples is provided here:

Example 1 includes a circuit board system comprising a first circuit board comprising a substrate and a first component susceptible to electromagnetic interference carried by the substrate, a second circuit board comprising a second substrate, and a shield engaged to the substrate of the first component, the shield at least partially covering the first component and being configured to protect the first component from electromagnetic interference, wherein the shield couples the substrate of the first circuit board to the substrate of the second circuit board.

Example 2 includes the circuit board system of Example 1, wherein the substrate of the first circuit board is pivotable relative to the substrate of the second circuit board while the substrates are coupled by way of the shield.

Example 3 includes the circuit board system of any of Examples 1-2, further comprising a flexible circuit coupled to the first circuit board and/or the second circuit board.

Example 4 includes the circuit board system of any of Examples 1-3, wherein the shield non-pivotably fixes the substrate of the first circuit board relative to the substrate of the second circuit board.

Example 5 includes the circuit board system of any of Examples 1-4, further comprising a connection mechanism coupled to the shield for connecting the substrate of the first circuit board to the substrate of the second circuit board.

Example 6 includes the circuit board system of Example 5, wherein the connection mechanism comprises an opening in the shield that receives a connector.

Example 7 includes the circuit board system of any of Examples 1-6, wherein the shield substantially completely encapsulates the first component to insulate the component from electromagnetic interference.

Example 8 includes a circuit board system comprising a first circuit board comprising a substrate and a first component susceptible to electromagnetic interference carried by the substrate, and a shield engaged to the substrate, the shield at least partially covering the first component and being configured to protect the first component from electromagnetic interference, wherein the shield comprises a connection mechanism for coupling the substrate to a separate component.

Example 9 includes the circuit board system of Example 8, wherein the separate component is a second circuit board.

Example 10 includes the circuit board system of any of Examples 8-9, wherein the substrate is rigid.

Example 11 includes the circuit board system of any of Examples 8-10, further comprising a flexible circuit coupled to the first circuit board.

Example 12 includes the circuit board system of any of Examples 8-11, wherein the connection mechanism is a one-piece construction.

Example 13 includes the circuit board system of Example 12, wherein the connection mechanism comprises an opening in the shield that receives a connector.

Example 14 includes a method of assembling a circuit board system comprising providing a first circuit board comprising a substrate and a first component susceptible to electromagnetic interference carried by the substrate, and coupling the substrate of the first circuit board to a substrate of a second circuit board using a shield, wherein the shield at least partially covers the first component and is configured to protect the first component from electromagnetic interference.

Example 15 includes the method of Example 14, further comprising positioning the substrate of the first circuit board relative to the substrate of the second circuit board in a first orientation, and fixing the substrates in the first orientation.

Example 16 includes the method of Example 15, wherein the shield acts as a substantially rigid interface between the substrates of the first and second circuit boards to fix the substrates in the first orientation.

Example 17 includes the method of any of Examples 14-16, wherein the shield substantially completely encapsulates the first component to insulate the component from electromagnetic interference.

Example 18 includes the method of any of Examples 14-17, wherein the circuit board system further comprises a flexible circuit, and the method further comprises passing the flexible circuit through an opening in the shield to couple the shield to the flexible circuit.

Example 19 includes the method of any of Examples 14-18, wherein the shield is composed of metal that is resistant to electromagnetic interference.

Example 20 includes the method of Example 16, wherein the substrates of the first and second circuit boards are positioned at an angle relative to each other in the first orientation.

What is claimed is:

1. A circuit board system comprising:
   a first circuit board comprising a substrate and a first component susceptible to electromagnetic interference carried by the substrate;
   a second circuit board comprising a second substrate; and
   a shield component engaged to the substrate of the first component, the shield component at least partially covering the first component and being configured to protect the first component from electromagnetic interference, wherein the shield component non-pivotably fixes the substrate of the first circuit board to the substrate of the second circuit board.

2. The circuit board system of claim 1, wherein the shield component couples together the substrates of the first circuit board and the second circuit board together such that the substrates have fixed positions relative to one another.

3. The circuit board system of claim 1, further comprising a flexible circuit coupled to at least one of the first circuit board and the second circuit board.

4. The circuit board system of claim 1, further comprising a connection mechanism incorporated in the shield component, the substrate of the first circuit board being fixed to the substrate of the second circuit board via the connection mechanism.

5. The circuit board system of claim 4, wherein the connection mechanism comprises an opening in the shield component, a connector being received in the opening.

6. The circuit board system of claim 1, wherein the shield component substantially completely encapsulates the first component to insulate the first component from electromagnetic interference.

7. A circuit board system comprising:
a first circuit board comprising a substrate and a first component susceptible to electromagnetic interference carried by the substrate; and
a shield engaged to the substrate, the shield at least partially covering the first component and being configured to protect the first component from electromagnetic interference, the shield component comprises a connection mechanism for coupling the substrate to a separate component such that the substrate is non-pivotably fixed to the separate component.

8. The circuit board system of claim 7, wherein the separate component is a second circuit board.

9. The circuit board system of claim 7, wherein the substrate is rigid.

10. The circuit board system of claim 7, further comprising a flexible circuit coupled to the first circuit board.

11. The circuit board system of claim 7, wherein the connection mechanism is of one-piece construction.

12. The circuit board system of claim 11, wherein the connection mechanism comprises an opening in the shield for receiving therethrough a connector.

13. A method of assembling a circuit board system comprising:
providing a first circuit board comprising a substrate and a first component susceptible to electromagnetic interference carried by the substrate; and
using a shield component, coupling the substrate of the first circuit board to a substrate of a second circuit board such that the substrate of the first circuit board is non-pivotably fixed to the substrate of the second circuit board, and such that the shield component at least partially covers the first component and is configured and positioned to protect the first component from electromagnetic interference.

14. The method of claim 13, further comprising positioning the substrate of the first circuit board relative to the substrate of the second circuit board in a first orientation, and fixing the substrates in the first orientation.

15. The method of claim 14, wherein the shield component acts as a substantially rigid interface between the substrates of the first and second circuit boards to fix the substrates in the first orientation.

16. The method of claim 13, wherein the shield component substantially completely encapsulates the first component to insulate the component from electromagnetic interference.

17. The method of claim 13, wherein the circuit board system further comprises a flexible circuit, the method further comprising passing the flexible circuit through an opening in the shield component to couple the shield component to the flexible circuit.

18. The method of claim 13, wherein the shield component is composed of metal that is resistant to electromagnetic interference.

19. The method of claim 15, wherein the substrates of the first and second circuit boards are positioned at an angle relative to each other in the first orientation.

* * * * *